United States Patent [19]

Yakubowski

[11] 3,730,595

[45] May 1, 1973

[54] LINEAR CARRIER SENDER AND RECEIVER

[75] Inventor: Carl Yakubowski, Poughkeepsie, N.Y.

[73] Assignee: International Business Machines Corporation, Armonk, N.Y.

[22] Filed: Nov. 30, 1971

[21] Appl. No.: 203,374

[52] U.S. Cl. ................302/2 R, 214/16.4 R, 221/88

[51] Int. Cl. ................B65g 51/02

[58] Field of Search ................214/164 R; 302/2 R, 302/2 A, 29, 31

[56] References Cited

UNITED STATES PATENTS 3,645,581 2/1972 Lasch ................302/2 R

*Primary Examiner*—Robert G. Sheridan
*Assistant Examiner*—R. Johnson
*Attorney*—J. Jancin, Jr. et al.

[57] ABSTRACT

A wafer transfer and handling apparatus having an indexable carrier for transferring wafers to and from work stations. A wafer on an air slide enters the wafer carrier with the aid of a directional air jet force supplied by the wafer mechanism. A photocell detects a wafer entering the carrier and activates an air cyclinder to move from left to right, thereby permitting an escapement rack to index in a vertical direction. The index rack is adapted for vertical movement, the rack having laterally extending, horizontally disposed, interleaving indexing elements which are spaced apart for cooperation with an escapement pin that slides back and forth across the rack to permit indexing of the rack from one interleaved indexing element to the next. The indexing is repeated until the wafer carrier is full or empty whereupon a limit switch is activated to indicate this to an operator. The carrier is adapted for loading or unloading wafers.

4 Claims, 10 Drawing Figures

LINEAR CARRIER SENDER AND RECEIVER

BACKGROUND OF THE INVENTION

Figure 1:
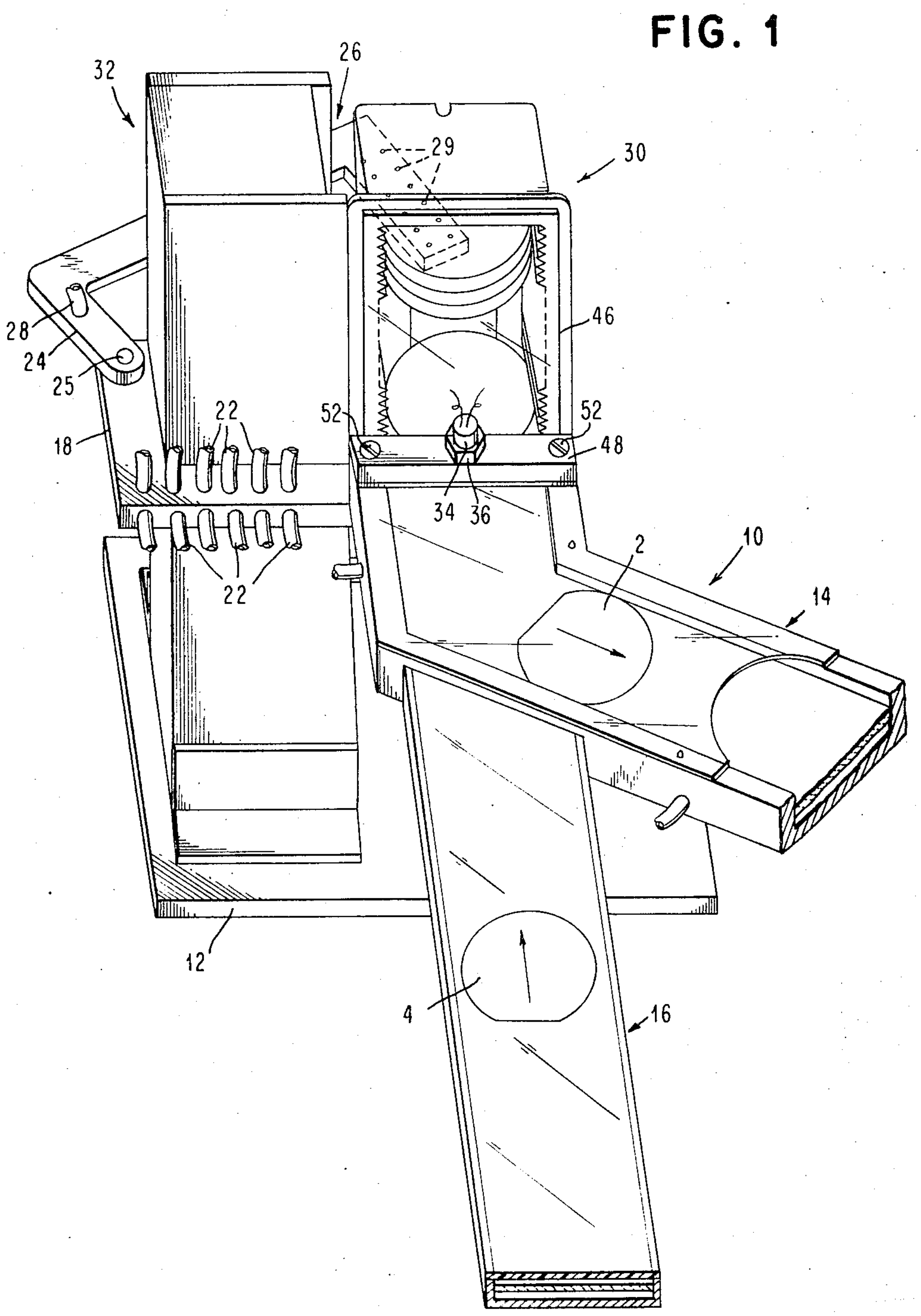

This invention relates generally to wafer transfer and handling apparatus and more particularly to an indexing mechanism for loading and unloading wafers from a carrier to and from associated air slide.

Wafers contained in linear carrier must be individually removed and replaced many times during the manufacturing process. With the existence of high throughput, automatic process equipment automatic wafer handling is most essential. Indexing of the carrier must be made accurately so as to allow the incoming wafer to continue into the carrier. There is a critical need in having the carrier index with a controlled speed displacement so that the carrier does not come down too fast so that the wafers are not lodged between the wafer drive and the carrier and damaged. Test devices which use a normal rack and pinion mechanism for indexing the carrier are usually freefall devices and present problems in controlling the speed of the indexing operation. Also, other indexing methods have used expensive logic or servo controls in a closed loop hydraulic servo mechanism with photosensors to accomplish the indexing. The prior art has failed to provide a reliable and inexpensive indexing mechanism which is simple and is mechanical in nature.

It is, therefore, an object of the present invention to index a carrier with controlled speed displacement in an improved manner.

It is another object of this invention to index a carrier in such a manner that will not raise or lower the carrier too fast so that a wafer being loaded into and removed from the carrier will not be lodged between the wafter drive and the carrier.

Another object of the present invention is to facilitate the handling of fragile work pieces.

In carrying out the objects of this invention, I provide an indexable wafer carrier placed on a carrier platform which can be indexed in a downward direction with controlled speed displacement under the control of gravity along with a continuously running motor in conjunction with an over-running clutch. In the preferred embodiment of this invention, a full carrier is placed on the carrier platform when the platform is in the full upward position. The carrier is indexed by opening or closing a solenoid air valve which acts on a single acting air cylinder which, in turn, pushes and pulls a pin slide assembly. The frequency of the push and pull action controls the indexing rate. An escapement rack is attached to the indexing mechanism so that the carrier is indexed as the pin slide assembly moves across ribs of the escapement rack. The pin on the slide acts as a mechanical indexing stop on the escapement rack while the pin is in contact with the ribs of the rack. When the pin on the slide is not in contact with the rubs of the escapement rack, the escapement rack is free to fall under the influence of gravity, but will not fall with increasing velocity since it is connected to the continuously running motor in conjunction with the over-running clutch. The speed of the motor drive controls the permissible rate of descent of the carrier.

In order to facilitate the handling of the fragile wafers, a wafer ejector acceptor arm having directional air jets on each side, on one side or top side of the wafer drive the air jets are directed in the eject position to drive the wafer out of the carrier, while the bottom side of the wafer drive has the air jets directed in the receive position to drive the wafer into the carrier. The wafer ejector acceptor arm controls the driving of the wafers into or out of the carrier from or to an air slide which will move the wafers to or from a work station. A photodiode placed on the directional air slide just in front of the carrier detects the movement of a wafer into or out of the carrier. This sensor activates the necessary mechanism to control the indexing of the carrier after a predetermined amount of time has elapsed, this time being enough to allow the wafer to be either completely removed from or loaded into the carrier safely. The wafer drive can be pivotable so as to swing into and out of the carrier for loading and unloading the carrier on the indexing unit or can be fixed to the indexing mechanism itself.

Figures 2, 3:
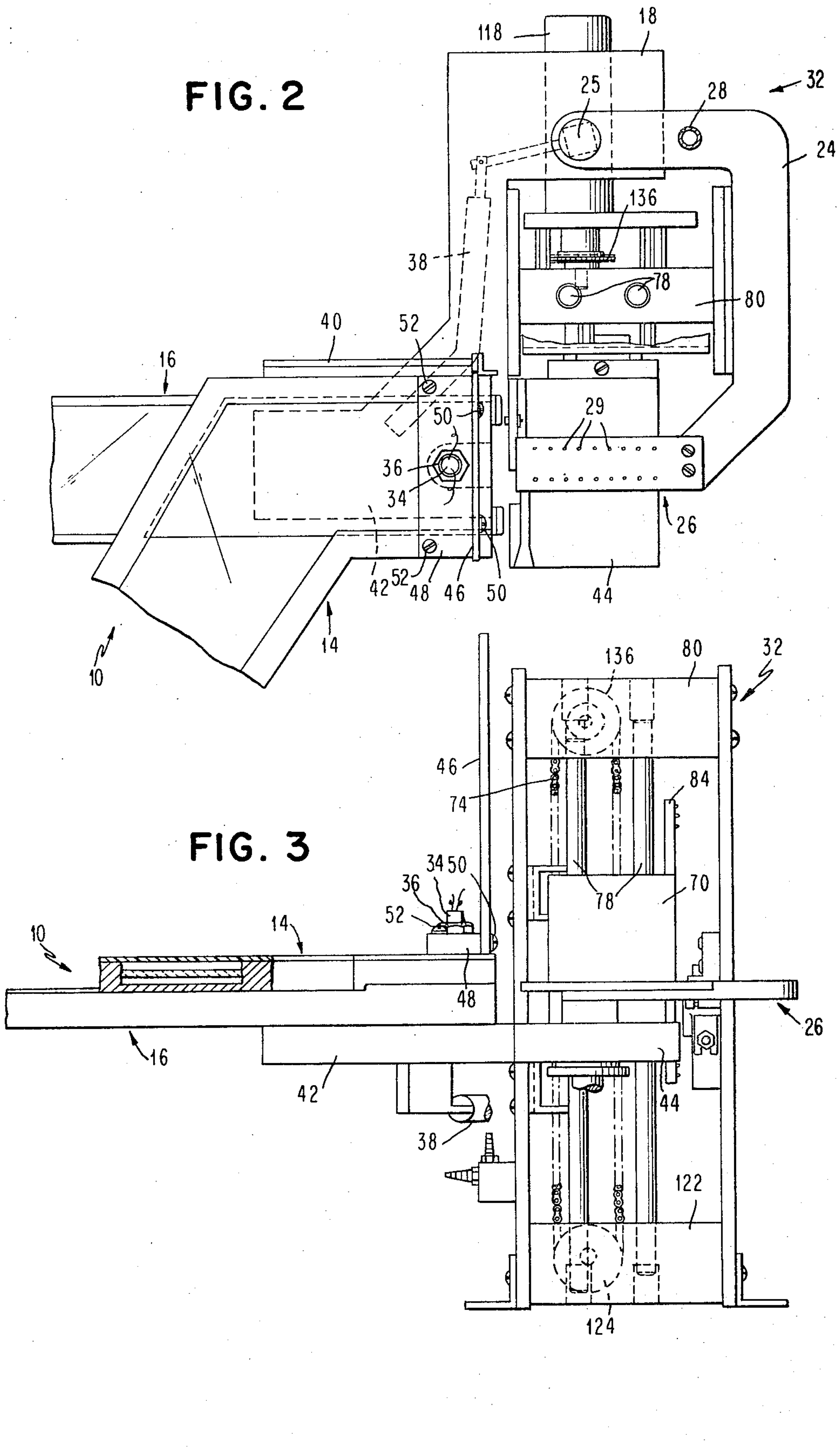
Figure 4:
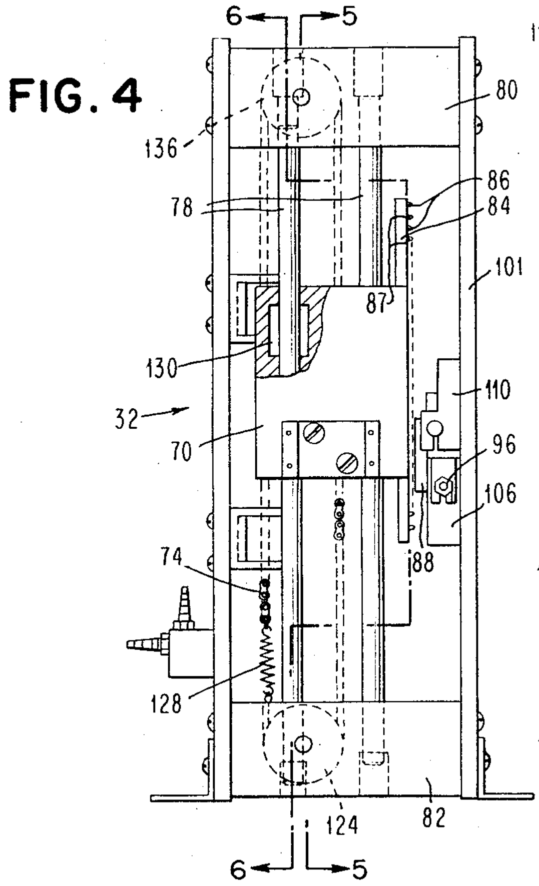
Figure 5:
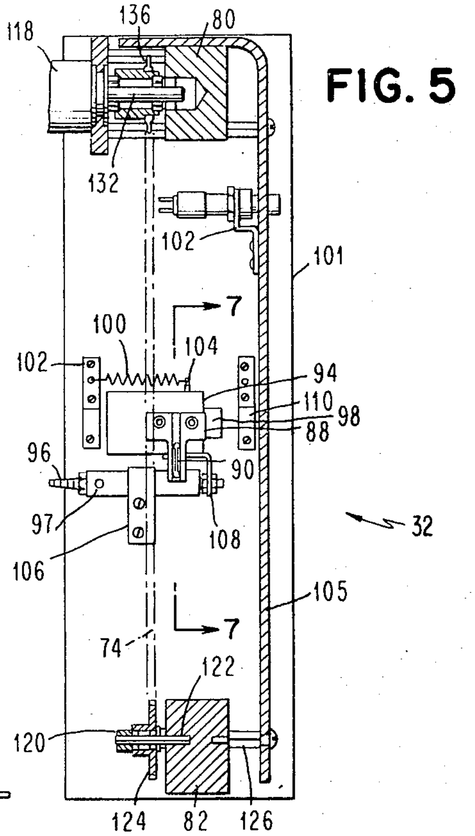
Figure 7:
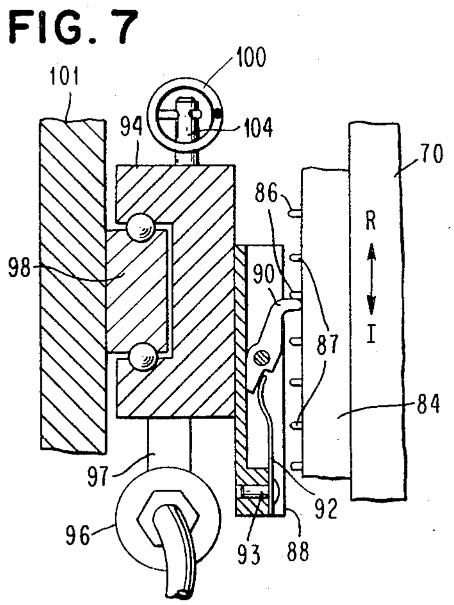
Figure 6:
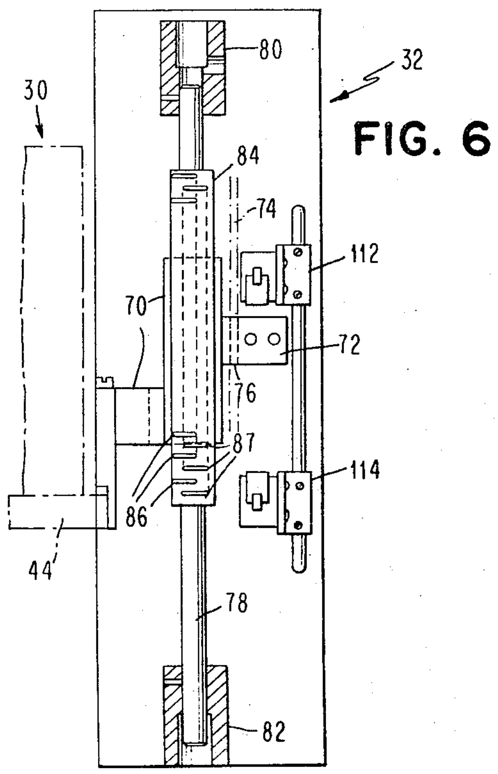
Figure 9:
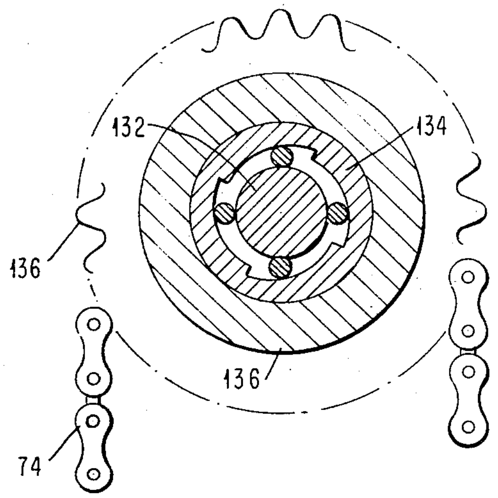
Figure 8:
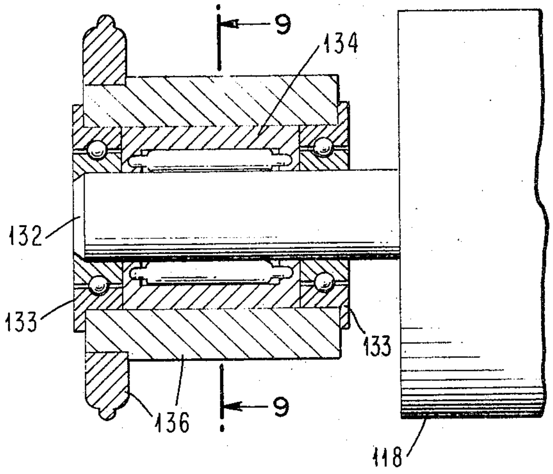
Figure 10:
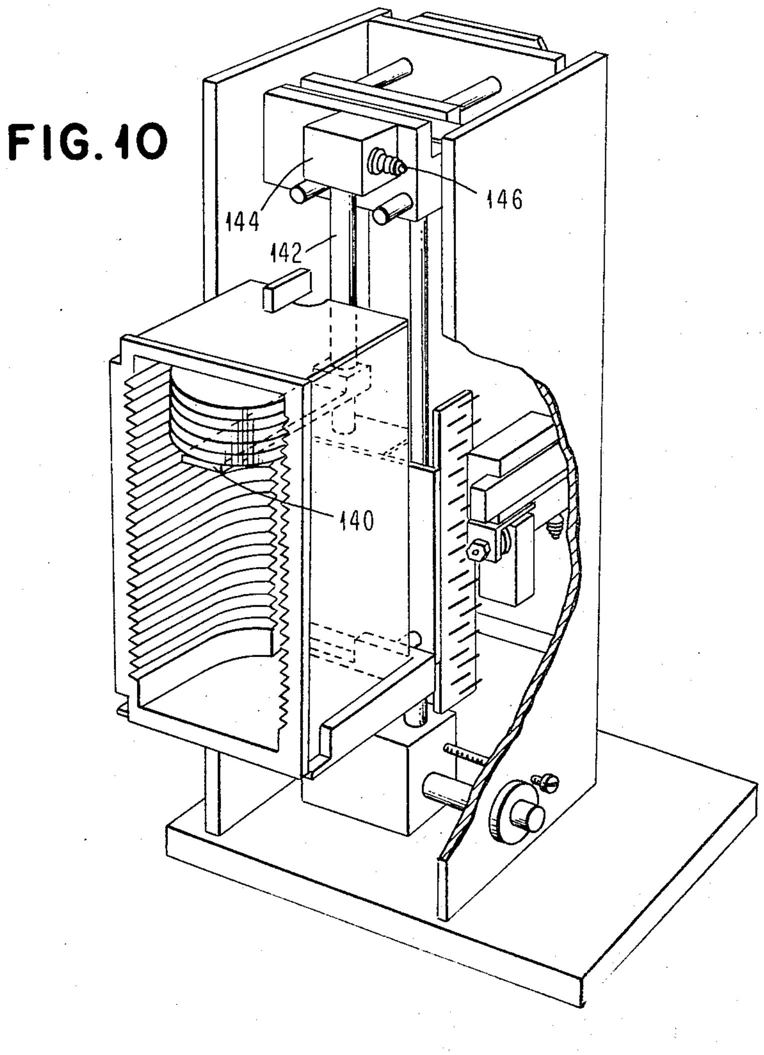

The foregoing and other objects, features, and advantages of the invention will be apparent from the following more particular description of the preferred embodiment of the invention, as illustrated in the accompanying drawings, in which:

FIG. 1 shows a perspective view of the preferred embodiment of a linear carrier sender and a receiver machine embodying the invention, FIG. 2 is a top plan view of the dual air slide and indexing unit shown in FIG. 1, FIG. 3 is a side view of the dual air slide and indexing unit shown in FIG. 1, FIG. 4 is a more detailed side view of the dual air slide, showing in more detail the indexing unit, FIG. 5 is a sectional view on line 5—5 of FIG. 4 showing the pin slide assembly, FIG. 6 is a sectional view on line 6—6 of FIG. 4 showing the escapement rack assembly, FIG. 7 is an enlarged sectional view on line 7—7 of FIG. 5 showing the pin slide assembly and rack in detail, FIG. 8 is an enlarged view of the clutch motor assembly for driving the indexing unit, FIG. 9 is a sectional view on line 9—9 of FIG. 8, and FIG. 10 shows another embodiment of this invention wherein wafers are moved from a carrier to a work station.

In FIGS. 1, 2, and 3 there is illustrated more or less schematically one form of the linear carrier sender and receiver machine, constructed in accordance with the principles of the invention, for transferring wafers between a magazine and a dual air slide by means of a wafer ejector acceptor drive mechanism. Reference 10 is a bidirectional air slide assembly set on base 12 which carries wafers between a work station (not shown) and an indexing carrier or magazine 30. Bidirectional air slide assembly 10 consists of a feed air slide 14 which sends wafers from the carrier 30 positioned above a return air slide 16 which returns wafers 4 to the carrier from a work station. Various light shields are provided to filter out any light that could damage the wafers. The light shields also helps prevent an operator from spilling the wafers. Fixed in any suitable manner to the dual air slide assembly 10 are upper light shield 40 and lower light shield 42. Also a third shield 46 is attached to the dual air slide assembly at attaching the shield to bracket 48 by nut 50 and in turn attaching bracket 48 to the dual air slide by nut 52.

Shield 46 extends longitudinally in position parallel to the magazine 30. Also photocell 34 is fixed to the dual air slide assembly by any suitable means such as by nut 36. Photocell 34 detects the movement of a wafer to or away from the magazine 30. Indexing carrier or magazine 30 is positioned upon carrier platform 44 which is part of the indexing unit 32. Indexing unit 32 indexes carrier platform 44 thereby magazine 30 in either the upward or downward longitudinal direction in order to place succeeding positions for storing wafers in magazine 30 next to the wafer ejector acceptor arm 26. Wafer ejector acceptor arm 26 contains air jets 29 on each side of wafer ejector acceptor arm 26. On one side or the top side of the wafer drive, the air jets are directed in the eject positions to drive the wafer out of the carrier onto the top air slide while the bottom side of the wafer drive has the air jets directed in the receive position to drive the wafers from the bottom slide 16 into the magazine or carrier 30. Wafer arm 26 may be either fixed to indexing unit 32 or as shown in the preferred embodiment in FIG. 1, the wafer arm may be pivotable so as to swing into an out position for loading and unloading the magazines on the unit.

As shown in FIGS. 1 and 2, wafer ejector acceptor arm 26 is pivoted about pivot point 25 by connecting wafer arm 26 to the pivot point by pivoting panel 24. Air hose 28 is provided to provide pressure to the wafer arm 26. Pivoting panel 24 is pivotally mounted at pivot point 25 to the dual air slide support 18 which is in turn fixed by any suitable means to the dual air slide 10. Air hoses 22 supply air pressure from a source (not shown) to various parts of the air slide and indexing unit as needed.

FIGS. 4 through 7 show a more detailed view of the indexing unit 32. Magazine 30 is indexed in a longitudinal direction and is positioned on carrier platform 44 which is in turn fixedly attached to platform support 70. Platform support 70 is guided by shafts 78 as it is indexed in the longitudinal direction. Shafts 78 are themselves fixed to the indexing unit by being inserted into block 80 at the top of the unit and into support 82 at the bottom of the unit. Various bearings can be used between the shaft 78 and the platform support 70 such as the bearing shown at reference 130.

The means to bias the movement of supporting block 70 along the shafts 78, and thereby bias the movement of the magazine carrier along the longitudinal path is shown best in FIGS. 4 and 5. In this preferred embodiment, motion control for uniform velocity indexing of the magazine is obtained by the force of gravity in conjunction with a continuously running motor along with an over-running clutch. As the supporting block 70 is moved in the downward direction under the force of gravity, the clutch assembly cannot move faster than the continuously running motor and thereby the carrier cannto be indexed downwardly at a speed higher than the speed of the continuously running motor. This enables the mechanism to be indexed with uniform velocity. The motor and clutch mechanism is more specifically shown in FIGS. 8 and 9. As shown in FIGS. 8 and 9, motor 118 is continuously running so as to drive shaft 132, which is surrounded by appropriate support bearing 133. Clutch 134 acts in conjunction with the motor drive and the chain sprocket housing assembly 136 to prevent the chain 74 from being driven by the chain sprocket assembly 136 in a manner to be described in more detail later. Chain 74 is fixed at the bottom of the indexing unit by sprocket 124 which is connected to support 82 by axle 122. The other end of axle 122 is placed in collar 120. Another portion of chain 74, referred to by reference number 76, is securely attached to a bracket 72 which is, in turn, attached by any suitable means to the back of platform support 70. Thus, any moment in chain 74 will cause longitudinal movement of platform 70 and thereby magazine 30. It is through this connection between the continuously running motor, the clutch mechanism and the effect of gravity that uniform motion control is able to be obtained in indexing the magazine 30.

Platform support 70 is alternatively released and retained to allow the action of the motor and over-running clutch to cause the platform support and thereby the magazine to be indexed in either longitudinal direction. While in the preferred embodiment of this invention, the indexing in the downward direction is accomplished essentially under the force of gravity, it would be obvious to one skilled in the art to modify this invention by adding a spring assist to allow the device to be used to index in the up direction. The means to allow the movement of platform support 70 from a retain position is shown best in FIGS. 5, 6, and 7. This means consists, generally, of a track means fixed to the side of platform 70 to define step increments for the indexing operation and tracking means traversely across the track means to allow control movement of the platform support.

Rack 84 is secured to the side of platform support 70 by any suitable means. Rack 84 has track means or ribs 86 and 87 protruding from the rack in two longitudinal paths, as shown in FIG. 6. One set of the ribs is designated by numeral 86 and the other set designated by numeral 87. Each set of ribs is placed in alternating relationship and placed on opposite sides of the rack 84. The longitudinal distance between a rib 86 and a rib 87 is defined as a step increment. This step increment is the distance that separates the wafers in the carrier.

Rack 84 is indexed by moving a tracking means across the ribs 86 and 87 by a drive means. More specifically, as shown in FIG. 7, pawl or pin 190 is the tracking means which is driven across the ribs 86 and 87 to allow the index rack 84 to be indexed under the action of the motor and over-running clutch assembly. When pawl 90 is not driven across the ribs of the index rack to hold the index rack in the retain position. Pawl 90 is pivotally mounted on support block 88 and retained in a biased position by spring 92 which it, itself, secured to block 88 by nut slide 93.

The means to alternately move the tracking means transversely across the track means is shown best in FIGS. 5 and 7. Air under pressure is supplied to air nozzle 96. Air nozzle 96 is secured to air supply block 97 which has in it a solenoid air valve which is opened and closed by air under pressure and which acts on a single acting air cylinder which, in turn, pushes or pulls the pawl 90 and ball slide assembly 94. Air cylinder 97 is secured to the housing on the right side plate 101 by clamp 106. A bracket 108 is secured on the piston rod of air cylinder 97 so as to move in conjunction with the air cylinder. Bracket 108 is secured at the other end to the ball slide assembly 94 so that the motion of the air cylinder can be transfered to the ball slide assembly and thereby to the pawl or pin 90. Ball slide assembly 94 is capable of movement in a direction transverse of the rack 84. The ball slide assembly 94 is moved in one direction under the action of the air pressure and is returned in the opposite direction under the action of spring 100. Spring 100 is fixed to the ball slide assembly by spring holder 104 and is attached at its other end to block 102. Block 102 is secured to right side plate 101 of the housing and acts both as a support for spring 100 and as a stopper to control the amount of movement of the ball slide 94. Another block 110 is secured to the front cover 105 of the housing and also contains a bumper to stop the movement of the balls slide assembly 94 at the other end of its travel. Thus, the action of the air cylinder is transferred through a series of clamps to the ball slide assembly and thereupon to the pawl housing which ultimately causes the pawl to slide across the ribs of the rack.

Another embodiment of this invention is shown in FIG. 10. FIG. 10 represents a wafer handling unit which is adaptive only to remove wafers from a magazine and deliver them to a work station. This embodiment does not have the capability of receiving wafers into the magazine from a work station. The only difference between the sender unit and the preferred embodiment of this invention is that the wafer ejector acceptor arm only has directional air holes on one side which force the wafer out of the carrier. Also the embodiment shown in FIG. 10 shows the wafer ejector acceptor arm 140 being connected to air supply tube 142 which is, in turn, fixed to top block 144. Air is inputted through nozzle 146 which is inserted into block 144. In this embodiment, the wafer ejector acceptor arm is not pivotable so as to be able to be moved out of the way of the carrier when the carrier is being removed from and put onto the carrier platform.

OPERATION

The operation of one embodiment of this invention will be described with reference to the operation of loading wafers onto the wafer carrier. It is understood that another embodiment of this invention will operate also to remove wafers from a loaded wafer carrier. A wafer 4 enters the wafer carrier 30 from the return air slide with the aid of a directional air jet force from the bottom side air nozzles of the wafer ejector acceptor mechanism 26. When the wafer enters the wafer carrier, photocell 34 is made and broken to control the air cylinder in the air supply block 97 to move from left to right, thereby driving the pawl 90 transversely across a rib 86 of rack 84. Thus, the escapement rack 84 is permitted to index in a downward direction under gravity uniformly because of the constant drive of the motor and over-running clutch assembly. The indexing operation is stopped by the next rib 87 acting as a mechanical stop. The next movement of the rack will be caused by a wafer being removed from the air slide causing pawl 90 to move from right to left across rib 87 until indexing occurs and finally until the next rib 86 acts as a stopper. This operation is repeated successively until the wafer carrier is full. Limit switches 112 and 114 are positioned at the upper and lower extremes of travel of the rack and signal to an operator that the carrier is loaded or empty. The limit switches could also be used to activate circuitry to automatically move the carriage to a position to begin work again. At this time, the wafer ejector acceptor arm 26 is pivoted out of carrier 30, so that the carrier can be removed from the platform without damaging the wafers. It is to be understood that there are many ways in which the wafer handler and transfer mechanism can be used depending upon the particular job needed to be performed on the wafer. The wafer handling and indexing mechanism is designed to enable a variety of operations to be performed. In the preferred embodiment shown in FIG. 1, wafers can be loaded and unloaded from a carrier intermittently instead of loading the carrier completely or unloading the carrier completely. Thus, a first wafer could be removed from the carrier and a second wafer removed from the carrier with the first wafer being reloaded onto the carrier before any more wafers are subsequently removed. This kind of operation can be controlled by a manual operator or by any suitable circuitry. The preferred embodiment of this invention would perform this type of an operation by having the wafers being from and loaded onto the carrier operate a photocell which controls further indexing of the carrier after a certain amount of time has passed after a wafer is removed from the photocell area.

Although the preferred embodiment shows the use of a continuously running motor in conjunction with an over-running clutch to obtain uniform motion, other mechanical means can be substituted to give the same result. One possible alternative would be to obtain uniform motion control by using a speed control unit and constant force springs to bias the movement of the carrier in the upward direction. In another embodiment of this invention, the wafer handler could be a specifically designed for the removal of wafers from the carrier. In this embodiment, the carrier would be loaded onto the carrier platform at the topmost position of its travel. It would then be indexed downwardly until a limit switch was hit indicating that the carrier was completely filled. In this embodiment, uniform motion could be obtained by the carrier in the longitudinal direction. In the preferred embodiment shown in FIG. 1, the carriage is returned by reversing motor 118 which will engage the free-running clutch to provide the necessary drive to raise the carriage against the bias of the escapement pawl 90.

In the embodiment where the carriage is indexed upwardly, constant force springs may be employed to provide upward bias in conjunction with reversing the tracking bias of escapement pawl 90. If desired, a driven free running clutch may be used for returning the carriage or reversal of the clutch drive, or alternatively the carriage may be returned manually against the bias of the escapement pawl.

While the invention has been particularly shown and described with reference to a preferred embodiment thereof, it will be understood by those skilled in the art that the foregoing and other changes in form and detail may be made therein without departing from the spirit and scope of the invention.

I claim:

1. An indexing mechanism comprising:

a carriage means adapted for movement in a longitudinal path;

means to bias the movement of said carrier in said path;

track means extending longitudinally along said carriage, said track means defining a path alternating in opposite directions transverse the path and defining longitudinally extending step increments;

tracking means to follow said track means; and drive means adapted to alternately move said tracking means transversely of said path for controlled retention at the limit of travel in each direction.

2. An indexing mechanism comprising:

a carriage adapted for movement in a longitudinal path;

means to bias the movement of said carrier in said path;

track means extending longitudinally along said carriage, said track means having a longitudinally extending series of parallel ribs with successive ribs disposed alternately on opposite sides of the carriage in overlapping relationship with adjacent ribs;

tracking means to follow said track means; and drive means to alternately move said tracking means transversely of said path for controlled retention at the limit of travel in each direction.

3. A wafer handling and transfer mechanism comprising:

an indexing carriage means;

a support;

a first transfer means fixed to said support for transferring wafers to said carriage means from a work station;

a second transfer means superimposed on said first transfer means for transferring wafers away from said carriage means to a work station;

a wafer drive eject and receiving unit having a first set of air jets to drive wafers out of said carriage means into said second transfer means and a second set of air jets to drive the wafers from said first transfer means to said carriage means, said wafer drive eject and receiving unit being connected to said support drive eject and receiving unit being connected to said support by a pivoting arm such that said wafer drive can be pivoted away from said carriage means when said carrier is being loaded and unloaded from a platform.

4. The wafer handling and transfer mechanism of claim 3 wherein said indexing carrier means further comprises:

a carrier adopted for movement in a longitudinal path; and means to bias the movement of said carrier in said path in both upward and downward direction.

* * * * *